United States Patent
Moon et al.

(10) Patent No.: US 7,648,894 B2
(45) Date of Patent: Jan. 19, 2010

(54) COATING COMPOSITION FOR INSULATING FILM PRODUCTION, PREPARATION METHOD OF INSULATION FILM BY USING THE SAME, INSULATION FILM FOR SEMI-CONDUCTOR DEVICE PREPARED THEREFROM, AND SEMI-CONDUCTOR DEVICE COMPRISING THE SAME

(75) Inventors: Myung-Sun Moon, Daejeon (KR); Min-Jin Ko, Daejeon (KR); Hye-Yeong Nam, Cheongju (KR); Jung-Won Kang, Seoul (KR); Bum-Gyu Choi, Daejeon (KR); Byung-Ro Kim, Daejeon (KR); Gwi-Gwon Kang, Daejeon (KR); Young-Duk Kim, Daejeon (KR); Sang-Min Park, Daejeon (KR)

(73) Assignee: LG Chem, Ltd., Seoul (KR)

( * ) Notice: Subject to any disclaimer, the term of this patent is extended or adjusted under 35 U.S.C. 154(b) by 14 days.

(21) Appl. No.: 12/010,541

(22) Filed: Jan. 25, 2008

(65) Prior Publication Data

US 2008/0145677 A1    Jun. 19, 2008

Related U.S. Application Data

(62) Division of application No. 10/516,493, filed on Jul. 22, 2005, now Pat. No. 7,345,351.

(30) Foreign Application Priority Data

Apr. 9, 2003    (KR) .................... 10-2003-0022307
Mar. 31, 2004   (WO) ............. PCT/KR2004/000747

(51) Int. Cl.
G12B 21/02    (2006.01)
H01L 21/20    (2006.01)
H01L 21/36    (2006.01)

(52) U.S. Cl. .................. 438/496; 438/114; 438/460; 438/465; 438/584; 257/E21.476; 257/E21.502

(58) Field of Classification Search .............. 438/149, 438/114, 460, 465; 428/447; 427/387, 372.2, 427/385.5; 257/634, 646, E21.502, E21.476, 257/E23.077, E31.119, E33.06
See application file for complete search history.

(56) References Cited

U.S. PATENT DOCUMENTS 5,179,185 A    1/1993   Yamamoto et al.

(Continued)

FOREIGN PATENT DOCUMENTS

EP    1 090 967 A2    4/2001

(Continued)

*Primary Examiner*—Charles D Garber
*Assistant Examiner*—Abdulfattah Mustapha
(74) *Attorney, Agent, or Firm*—McKenna Long & Aldridge LLP

(57) ABSTRACT

The present invention relates to a coating composition for insulating film production, a preparation method of a low dielectric insulating film using the same, a low dielectric insulating film for a semiconductor device prepared therefrom, and a semiconductor device comprising the same, and more particularly to a coating composition for insulating film production having a low dielectric constant and that is capable of producing an insulating film with superior mechanical strength (elasticity), a preparation method of a low dielectric insulating film using the same, a low dielectric insulating film for a semiconductor device prepared therefrom, and a semiconductor device comprising the same. The coating composition of the present invention comprises an organic siloxane resin having a small molecular weight, and water, and significantly improves low dielectricity and mechanical strength of an insulating film.

5 Claims, 1 Drawing Sheet

U.S. PATENT DOCUMENTS

| | | | |
|---|---|---|---|
| 5,496,402 A | 3/1996 | Sakamoto et al. | |
| 6,639,015 B1 | 10/2003 | Nakashima et al. | |
| 6,852,367 B2 * | 2/2005 | You et al. | 427/387 |
| 7,091,287 B2 | 8/2006 | Kwon et al. | |
| 2001/0055891 A1 | 12/2001 | Ko et al. | |
| 2002/0102413 A1 * | 8/2002 | Han et al. | 428/446 |
| 2002/0142586 A1 | 10/2002 | Shiota | |
| 2003/0055134 A1 * | 3/2003 | Yim et al. | 524/48 |

FOREIGN PATENT DOCUMENTS

| | | |
|---|---|---|
| JP | 3053529 | 3/1991 |
| JP | 3116733 | 5/1991 |
| JP | 8130247 | 5/1996 |
| JP | 10-316936 | 12/1998 |
| JP | 2000038509 | 2/2000 |
| JP | 2000-109697 | 4/2000 |
| JP | 2001115021 | 4/2001 |
| JP | 2001237240 | 8/2001 |
| JP | 2001-279163 | 10/2001 |
| JP | 2001308089 | 11/2001 |
| JP | 2001-354903 | 12/2001 |
| JP | 2002-038089 | 2/2002 |
| JP | 2002-038091 | 2/2002 |
| JP | 2002201415 | 7/2002 |
| JP | 2004277508 | 10/2004 |
| WO | WO 0174957 | 10/2001 |

* cited by examiner

COATING COMPOSITION FOR INSULATING FILM PRODUCTION, PREPARATION METHOD OF INSULATION FILM BY USING THE SAME, INSULATION FILM FOR SEMI-CONDUCTOR DEVICE PREPARED THEREFROM, AND SEMI-CONDUCTOR DEVICE COMPRISING THE SAME

This application is a Divisional of application Ser. No. 10/516,493 filed Jul. 22, 2005, now U.S. Pat. No. 7,345,351 which is hereby incorporated by reference as if fully set forth herein. This application claims the benefit of the Korean Patent Application No. 10-2003-0022307, filed on Apr. 9, 2003 and International Application No. PCT/KR2004/000747, filed Mar. 31, 2004, which are hereby incorporated by reference as if fully set forth herein.

TECHNICAL FIELD

The present invention relates to a coating composition for insulating film production, a preparation method of a low dielectric insulating film using the same, a low dielectric insulating film for a semiconductor device prepared therefrom, and a semiconductor device comprising the same, and more particularly to a coating composition for insulating film production having a low dielectric constant and being capable of producing an insulating film with superior mechanical strength (elasticity), a preparation method of a low dielectric insulating film using the same, a low dielectric insulating film for a semiconductor device prepared therefrom, and a semiconductor device comprising the same.

BACKGROUND ART

Recently, with enhanced integration of semiconductor devices, the wiring density has been increasing and the wiring spacing has been decreasing. This causes an increase of parasitic capacitance of metal wiring, which leads to such problems as RC delay, cross-talk, and increased power consumption. Resultantly, it is imperative to develop a low dielectric material for wiring.

For the insulating material of the conventional IC and LSI semiconductor devices, $SiO_2$ having a dielectric constant of 4.0 is primarily used. In addition, fluorine-doped silicate (F—$SiO_2$), a low dielectric material, is employed in some devices. However, F—$SiO_2$ becomes thermally unstable as the fluorine content increases, so that it is difficult to lower the dielectric constant to below 3.5. Accordingly, a variety of thermally stable organic and inorganic polymers having low polarity are being proposed.

Polyimide resin, polyarylene ether resin, aromatic hydrocarbon resin, and so forth are known as organic polymers having low dielectric constants. These organic polymers have dielectric constants ranging from 3.2 to 2.6. Because of their low glass transition temperatures, they have significantly weaker mechanical strength than $SiO_2$ and very high linear expansion coefficients. Such low thermal stability and elasticity and high linear expansion coefficient may impair reliability of devices or circuit boards.

In order to solve the thermal stability problem of organic polymers, development of organic silicate polymers using alkoxy silane based compounds is in progress. Organic silicate polymers are prepared by hydrolyzing alkoxy silane compounds in organic solvents and condensing the same. Alkoxy silane based compounds such as polymethylsilsesquioxane and polyhydrosilsesquioxane have relatively low dielectric constants of 3.0 or lower, and are thermally stable at 450° C. However, polysilsesquioxane may crack due to shrinkage stress applied in the hardening process, and it has insufficient mechanical strength. In addition, most currently used alkoxysilane based insulating materials have dielectric constants of 2.7 or higher, and it is a long-term objective to reduce the dielectric constant to 2.5 or lower and improve mechanical properties.

As a preparing method of an insulating film having a dielectric constant of 2.5 or lower, a method of preparing organic silicate nanoparticles having large molecular weight by hydrolysis and condensation using a basic catalyst and hardening them to prepare a porous insulating film has been proposed (Japan Patent Publication No. 2001-354903).

Also, a coating composition for insulating film production comprising an organic silicate polymer prepared using an acid catalyst and an organic silicate polymer prepared using a base catalyst has been proposed to improve the mechanical strength of porous insulating film.

However, when an acid catalyst reactant having a small molecular weight is mixed with a base catalyst reactant having a large molecular weight, the dielectric constant may increase abruptly. In particular, because the base catalyst is too reactive, only the acid catalyst is added to improve storage stability. However, when an acid catalyst is added to the base catalyst reactant used in hydrolysis condensation, a salt may be produced, which may cause generation of impurities during long-term storage. To solve this problem, a small amount of water is added to the coating composition for insulating film production to increase solubility of the salt impurities. In this case, the storage stability is improved, but the mechanical strength of the insulating film is not improved at all.

As described above, there have been many attempts to prepare an insulating film having a low dielectric constant and superior mechanical strength and elasticity. However, satisfactory improvement of both the dielectricity and mechanical strength of low dielectric insulating film or super low dielectric porous insulating film for semiconductor devices has not yet been attained.

DISCLOSURE

Technical Problem

Figure 1:
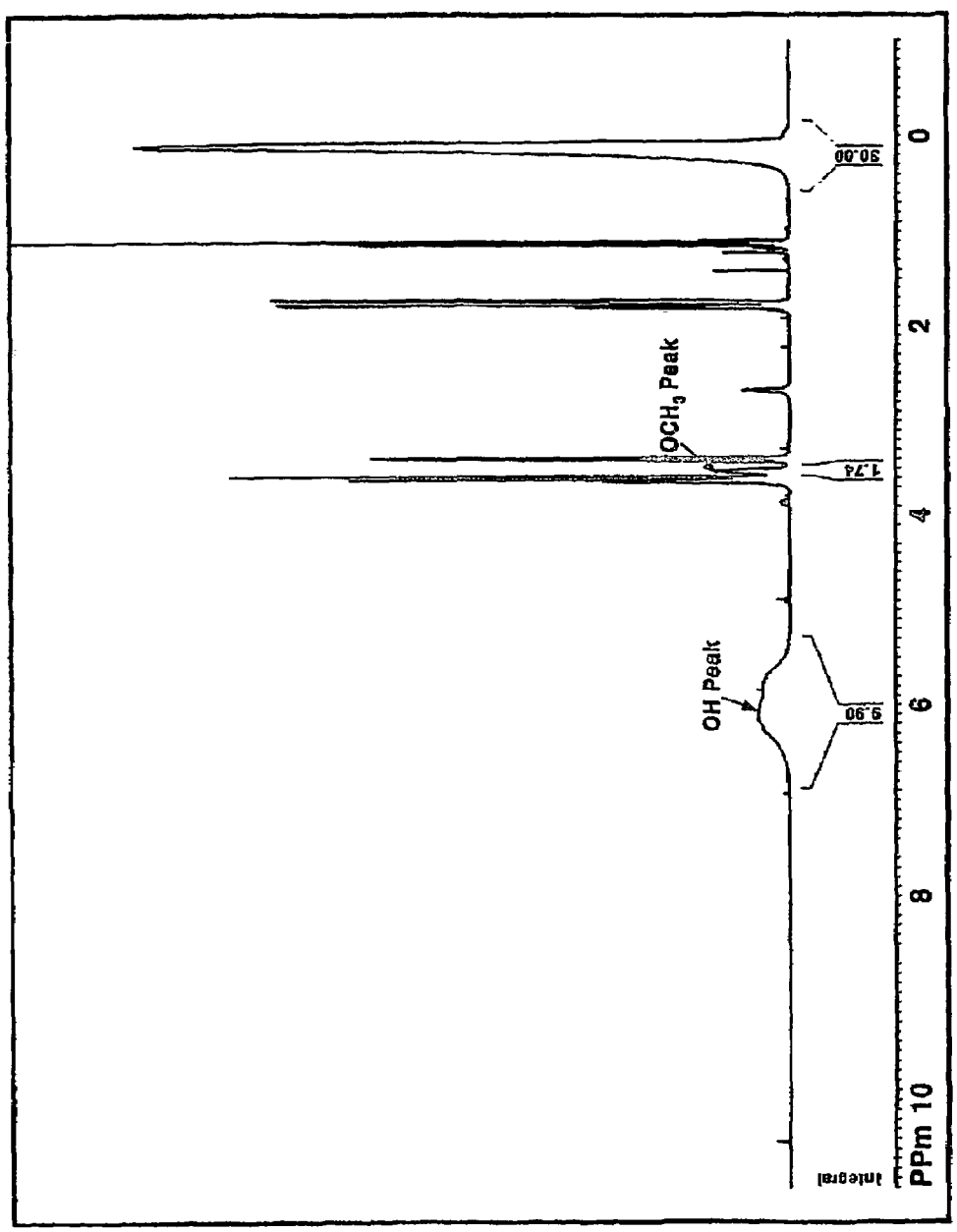
FIG. 1 is a graph showing the molar ratio of the hydroxy group of organic polysiloxane precursor prepared in Example 1, measured by $^1$H-NMR spectroscopy.

It is an object of the present invention to provide a coating composition for insulating film production having low dielectricity and improved mechanical strength (elasticity).

It is another object of the present invention to provide a preparation method of a low dielectric insulating film capable of significantly improving low dielectricity and mechanical strength of a semiconductor device.

It is still another object of the present invention to provide an insulating film for a semiconductor device having low dielectricity and significantly improved mechanical strength.

It is still another object of the present invention to provide a semiconductor device comprising an insulating film having low dielectricity and superior mechanical strength.

Technical Solution

To attain the objects, the present invention provides a coating composition for insulating film production comprising: a)

an organic polysiloxane precursor having a weight-average molecular weight ranging from 500 to 30,000; b) an organic solvent; and c) water.

The present invention also provides a preparation method of a low dielectric insulating film comprising the steps of: a) preparing an organic polysiloxane precursor having a weight-average molecular weight ranging from 500 to 30,000; b) preparing a coating composition for insulating film production by mixing i) the prepared organic polysiloxane precursor, ii) an organic solvent and iii) water; c) coating the coating composition for insulating film production on a substrate of a semiconductor device; and d) drying and baking the coated coating composition for insulating film production to form an insulating film.

The present invention also provides a low dielectric insulating film for a semiconductor device which is prepared by the above-mentioned method and comprises an organic polysiloxane polymer having one or more silane compounds selected from the group consisting of silane compounds represented by Chemical Formulas 1 to 3 below, dimers, or oligomers prepared therefrom as a hydrolyzed and condensed repeating unit.

         Chemical Formula 1 where $R^1$ is hydrogen, an aryl, a vinyl, an allyl, or a linear or branched $C_1$ to $C_4$ alkyl substituted by fluorine or unsubstituted;

$R^2$ is a linear or branched $C_1$ to $C_4$ alkoxy; and p is an integer of 1 or 2.

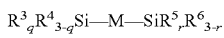
         Chemical Formula 2 where each of $R^3$ and $R^5$ is hydrogen, fluorine, an aryl, a vinyl, an allyl, or a linear or branched $C_1$ to $C_4$ alkyl substituted by fluorine or unsubstituted;

each of $R^4$ and $R^6$ is a linear or branched $C_1$ to $C_4$ alkoxy;

M is a $C_1$ to $C_6$ alkylene or phenylene; and each of q and r is an integer of 0 to 2.

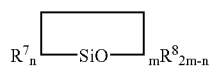
         Chemical Formula 3 where $R^7$ is hydrogen, fluorine, an aryl, a vinyl, an allyl, or a linear or branched $C_1$ to $C_4$ alkyl substituted by fluorine or unsubstituted;

$R^8$ is hydrogen, a hydroxy, or a linear or branched $C_1$ to $C_4$ alkoxy or —($CH_2$)a-$SiR^9R^{10}$ (where a is 2 or 3);

$R^9$ is fluorine, an aryl, a vinyl, an allyl, or a linear or branched $C_1$ to $C_4$ alkyl substituted by fluorine or unsubstituted;

$R^{10}$ is a linear or branched $C_1$ to $C_4$ alkoxy; and each of m and n is an integer of 3 to 7.

The present invention also provides a semiconductor device comprising such prepared insulating film for a semiconductor device.

ADVANTAGEOUS EFFECTS the present invention provides a coating composition for insulating film production having a low dielectric constant and significantly improved mechanical strength, an insulating film for a semiconductor device prepared by coating and hardening the composition, and a semiconductor device comprising the insulating film.

BEST MODE

The present inventors worked for a composition for insulating film preparation capable of improving both low dielectricity and mechanical strength. In doing so, they found that an insulating film prepared from a composition comprising a specific organic polysiloxane precursor having a small molecular weight, which was prepared in the presence of an acid catalyst, and a specific amount of water has better mechanical strength than insulating films prepared from compositions comprising no water or a trace of water while having low dielectricity. However, if the water content is too large, there is no improvement in mechanical strength, and physical properties such as storage stability and coatability worsen.

A low dielectric insulating film for a semiconductor device is prepared by coating a coating composition for insulating film production comprising an organic polysiloxane precursor on a substrate and baking it. In the balking process, silanol groups of the organic polysiloxane are condensed to form Si—O—Si bonds. In the case water is present in the composition, the silanol functional groups and water from hydrogen bonding, which improves intermolecular condensation during the baking process to form a network structure and increases reaction rate, increases cross-linkage density and improves mechanical strength.

The coating composition for insulating film production of the present invention comprises an organic polysiloxane precursor having a weight-average molecular weight ranging from 500 to 30,000, an organic solvent, and water.

In order to effectively improve low dielectricity and mechanical strength, the organic polysiloxane precursor preferably has a weight-average molecular weight ranging from 500 to 30,000, more preferably from 500 to 10,000.

If the weight-average molecular weight of the organic polysiloxane precursor is below 500, the coatability may worsen. Otherwise, if the weight-average molecular weight exceeds 30,000, the number of functional groups decreases significantly, so that improvement of mechanical strength is slight. Also, when an organic polysiloxane precursor having a weight-average molecular weight less than 30,000 and an organic polysiloxane precursor having a weight-average molecular weight exceeding 30,000 are used in admixture, the organic polysiloxane precursor having a smaller molecular weight prevents pore formation of the organic polysiloxane precursor having a larger molecular weight, so that it is difficult to attain low dielectricity.

Preferably, the organic polysiloxane precursor has 80% or more and more preferably 90% or more hydroxy groups by molar ratio in the entire condensable functional groups. If the molar ratio of hydroxy groups is below 80%, improvement of mechanical properties cannot be expected because the number of functional groups interacting with water is small and the cross-linkage density becomes low.

Also, preferably, the silane compound used to prepare the organic polysiloxane precursor has a molar ratio of unhydrolyzable functional groups and silicon atoms (functional group/Si) ranging from 0.35 to 0.75, so that the resultant insulating film has superior mechanical strength and insulating characteristics. If the functional group/Si ratio is below 0.35, the low dielectricity becomes poor although the mechanical strength is good. Otherwise, if it exceeds 0.75, improvement of the mechanical strength may be slight due to the lack of condensable functional groups and the mechanical strength is not good because of low cross-linkage density.

For the organic polysiloxane precursor, any organic polysiloxane precursor containing silicon, oxygen, carbon, and hydrogen atoms can be used. Preferably, the organic polysiloxane precursor has one or more silane compounds selected from the group consisting of silane compounds represented by Chemical Formulas 1 to 3 below, dimers, or oligomers derived therefrom as a hydrolyzed and condensed repeating unit.

$$SiR^1_p R^2_{4-p}$$ Chemical Formula 1 where
$R^1$ is hydrogen, an aryl, a vinyl, an allyl, or a linear or branched $C_1$ to $C_4$ alkyl substituted by fluorine or unsubstituted;
$R^2$ is a linear or branched $C_1$ to $C_4$ alkoxy; and
p is an integer of 1 or 2.

$$R^3_q R^4_{3-q} Si-M-SiR^5_r R^6_{3-r}$$ Chemical Formula 2 where
each of $R^3$ and $R^5$ is hydrogen, fluorine, an aryl, a vinyl, an allyl, or a linear or branched $C_1$ to $C_4$ alkyl substituted by fluorine or unsubstituted;
each of $R^4$ and $R^6$ is a linear or branched $C_1$ to $C_4$ alkoxy;
M is a $C_1$ to $C_6$ alkylene or phenylene; and
each of q and r is an integer of 0 to 2.

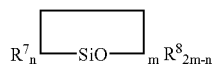

Chemical Formula 3 where
$R^7$ is hydrogen, fluorine, an aryl, a vinyl, an allyl, or a linear or branched $C_1$ to $C_4$ alkyl substituted by fluorine or unsubstituted;
$R^8$ is hydrogen, a hydroxy, or a linear or branched $C_1$ to $C_4$ alkoxy or $-(CH_2)a-SiR^9 R^{10}$ (where a is 2 or 3);
$R^9$ is fluorine, an aryl, a vinyl, an allyl, or a linear or branched $C_1$ to $C_4$ alkyl substituted by fluorine or unsubstituted;
$R^{10}$ is a linear or branched $C_1$ to $C_4$ alkoxy; and
each of m and n is an integer of 3 to 7.

For the organic solvent used in the coating composition for insulating film production of the present invention, any one that does not negatively affects the coatability of the insulating film may be used. Preferably, an ether based solvent or an ester based solvent is used.

For example, ether based solvents such as ethylene glycol monomethyl ether, ethylene glycol monoethyl ether, ethylene glycol-n-propyl ether, ethylene glycol dimethyl ether, ethylene glycol diethyl ether, propylene glycol monomethyl ether, propylene glycol monoethyl ether, propylene glycol monopropyl ether, propylene glycol dimethyl ether, propylene glycol diethyl ether, and propylene glycol dipropyl ether; and ester based solvents such as diethyl carbonate, methyl acetate, ethyl acetate, n-propyl acetate, i-propyl acetate, n-butyl acetate, ethyl lactate, ethylene glycol monomethyl ether acetate, ethylene glycol monoethyl acetate, propylene glycol monomethyl ether acetate, propylene glycol monoethyl ether acetate, propylene glycol monopropyl ether acetate, ethylene glycol diacetate, and propylene glycol diacetate may be used alone or in combination.

Preferably, a non-alcoholic ether based solvent or a non-alcoholic ester based solvent not containing terminal hydroxy groups is used to improve mechanical strength.

Preferably, the organic solvent is comprised at 200 to 2000 parts by weight for 100 parts by weight of the organic polysiloxane precursor. If the organic solvent content is below 200 parts by weight, the coatability and the storage stability of the insulating film may worsen. Otherwise, if it exceeds 2000 parts by weight, it is impossible to obtain an insulating film with an ideal thickness.

In the coating composition for insulating film production of the present invention, water is used to hydrolyze the silane compound. A specific amount of water is comprised in the coating composition. Preferably, water is comprised at 4 to 60 parts by weight, and more preferably at 10 to 40 parts by weight, for 100 parts by weight of the organic polysiloxane precursor. If the water content is below 4 parts by weight, improvement of mechanical strength and low dielectricity is slight. Otherwise, if it exceeds 60 parts by weight, the mechanical strength is not further improved, and the coatability and the solution storage stability may worsen.

The coating composition for insulating film production of the present invention may further comprise a pore generating material to obtain a uniform pore distribution and to prepare an insulating film having a dielectric constant of 2.5 or lower.

For the pore generating material, any one compatible with the organic polysiloxane precursor and the organic solvent and that is thermally decomposable in the temperature range of 200 to 450° C. may be used. Preferably, a linear organic molecule or polymer, a cross-linked organic molecule or polymer, a hyper-branched organic molecule or polymer, or a dendrimer organic molecule or polymer may be used.

Preferable examples of the pore generating material are an aliphatic ether or polyether, an aliphatic ester or polyester, an aliphatic carbonate or polycarbonate, and an aliphatic acrylate or polyacrylate having a repeating unit with 2 to 12 carbon atoms. Preferably, the pore generating material has a weight-average molecular weight ranging from 500 to 100,000 (polystyrene-converted molecular weight), and more preferably from 500 to 50,000.

Also, the pore generating material may comprise a silane compound to improve compatibility with the organic polysiloxane precursor. The pore generating material comprising a silane compound may be added in preparing the organic polysiloxane precursor for copolymerization.

Preferably, the pore generating material is comprised at 100 or less parts by weight, and more preferably at 5 to 100 parts by weight, for 100 parts by weight of the organic polysiloxane precursor. If the content of the pore generating material exceeds 100 parts by weight, the mechanical strength of the insulating film worsens.

The coating composition for insulating film production is prepared by a step of preparing an organic polysiloxane precursor having a weight-average molecular weight ranging from 500 to 30,000, and a step of mixing such prepared organic polysiloxane precursor with an organic solvent and water.

The organic polysiloxane precursor is prepared by hydrolysis and condensation by mixing a silane compound, an acid catalyst, and water, or a mixture of water and an organic solvent, in an acidic condition of pH 4 or less, preferably pH 1 to 4.

For the silane compound, any silane compound comprising silicon, oxygen, carbon, and hydrogen atoms may be used. Preferably, one or more silane compounds selected from the group consisting of silane compounds represented by Chemical Formulas 1 to 3, dimers, or oligomers prepared therefrom may be used.

The acid catalyst used in preparation of the organic polysiloxane precursor facilitates hydrolysis and condensation of the silane compound. The acid catalyst is not particularly limited. Preferably, hydrochloric acid, nitric acid, sulfuric acid, phosphoric acid, fluoric acid, formic acid, acetic acid, propionic acid, butanoic acid, pentanoic acid, hexanoic acid, monochloroacetic acid, dichloroacetic acid, trichloroacetic acid, trifluoroacetic acid, oxalic acid, malonic acid, sulfonic acid, phthalic acid, fumaric acid, citric acid, maleic acid, oleic acid, methylmalonic acid, adipic acid, p-aminobenzoic acid, or p-toluenesulfonic acid can be used. The catalyst may be used alone or in combination, simultaneously or continuously.

The content of the catalyst may be determined according to the reaction condition. Preferably, it is used at less than 2 moles, more preferably at 0.000001 to 2 moles, for 1 mole of the silane compound used in preparation of the organic polysiloxane precursor. If the content of the catalyst exceeds 2 moles for 1 mole of the silane compound, the reaction proceeds too fast even at a low concentration, so that it is difficult to control the molecular weight and gelation may occur too easily.

The organic polysiloxane precursor may be prepared from reaction in the presence of water and the organic solvent, from bulk reaction in water without the organic solvent, or from a combination of both.

Preferably, water is comprised at 3 to 40 moles for 1 mole of the silane compound. If the water content is below 3 moles, hydrolysis of functional groups becomes insufficient, so that the physical properties are negatively affected. Otherwise, if it exceeds 40 moles, the reaction solution becomes non-uniform.

For the organic solvent used in preparing the organic polysiloxane precursor, any one that does not prevent hydrolysis and condensation of the silane compound or silane oligomer may be used. Preferably, aliphatic hydrocarbon based solvents such as n-pentane, i-pentane, n-hexane, i-hexane, 2,2,4-trimethylpentane, cyclohexane, and methylcyclohexane; aromatic hydrocarbon based solvents such as benzene, toluene, xylene, trimethylbenzene, ethylbenzene, and methylethylbenzene; ketone based solvents such as acetone, methyl ethyl ketone, methyl-n-propyl ketone, methyl-n-butyl ketone, methyl-1-butyl ketone, diethyl ketone, cyclohexanone, methylcyclohexanone, and acetylacetone; ether based solvents such as tetrahydrofuran, 2-methyltetrahydrofuran, ethyl ether, n-propyl ether, i-propyl ether, n-butyl ether, diglyme, dioxin, dimethyldioxin, ethylene glycol monomethyl ether, ethylene glycol monoethyl ether, ethylene glycol-n-propyl ether, ethylene glycol dimethyl ether, ethylene glycol diethyl ether, propylene glycol monomethyl ether, propylene glycol monoethyl ether, propylene glycol monopropyl ether, propylene glycol dimethyl ether, propylene glycol diethyl ether, and propylene glycol dipropyl ether, ester based solvents such as diethyl carbonate, methyl acetate, ethyl acetate, n-propyl acetate, i-propyl acetate, n-butyl acetate, ethyl lactate, ethylene glycol monomethyl ether acetate, ethylene glycol monoethyl acetate, propylene glycol monomethyl ether acetate, propylene glycol monoethyl ether acetate, propylene glycol monopropyl ether acetate, ethylene glycol diacetate, and propylene glycol diacetate; or amide based solvents such as N-methylpyrrolidone, formamide, N-methylformamide, Methylformamide, N,N-dimethylformamide, N,N-diethylformamide, N-methylacetamide, N-ethylacetamide, N,N-dimethylacetamide, and N,N-diethylacetamide may be used alone or in combination.

Reaction temperature of hydrolysis and condensation in preparing the organic polysiloxane precursor is not particularly limited. Preferably, the reaction is performed in a temperature range of 0 to 100° C. The reaction temperature may be kept constant during the reaction, or it may be controlled intermittently or continuously during the reaction.

During the reaction, low alcohol is generated as reaction byproduct. Such low alcohol may impair coatability and mechanical strength of the insulating film. In addition, if an alcohol solvent having a high boiling point is comprised therein, the functional groups of the organic polysiloxane precursor may experience substitution, which negatively affects the mechanical strength. Therefore, it is preferable that the alcohol content is as low as possible.

The resultant organic polysiloxane precursor comprises one or more silane compounds selected from the group consisting of silane compounds represented by Chemical Formulas 1 to 3, dimers, or oligomers prepared therefrom as a hydrolyzed and condensed repeating unit. Preferably, it has a weight-average molecular weight ranging from 500 to 30,000.

In preparing the coating composition for insulating film production of the present invention comprising the organic polysiloxane precursor, the organic solvent used in preparing the organic polysiloxane precursor may be, used as it is. Or, a specific organic solvent may be removed from the organic solvent used in preparing the organic polysiloxane precursor and a new solvent may be added. Or, all of the organic solvent used in preparing the organic polysiloxane precursor may be removed and an organic solvent having a superior coatability may be added instead.

To take preferable examples of the organic solvent having a superior coatability, there are ether based solvents such as ethylene glycol monomethyl ether, ethylene glycol monoethyl ether, ethylene glycol-n-propyl ether, ethylene glycol dimethyl ether, ethylene glycol diethyl ether, propylene glycol monomethyl ether, propylene glycol monoethyl ether, propylene glycol monopropyl ether, propylene glycol dimethyl ether, propylene glycol diethyl ether, and propylene glycol dipropyl ether; and ester based solvents such as diethyl carbonates methyl acetate, ethyl acetate, n-propyl acetate, propyl acetate, n-butyl acetate, ethyl lactate, ethylene glycol monomethyl ether acetate, ethylene glycol monoethyl acetate, propylene glycol monomethyl ether acetate, propylene glycol monoethyl ether acetate, propylene glycol monopropyl ether acetate, ethylene glycol diacetate, and propylene glycol diacetate. One or more solvents selected from the above may be used alone or in combination.

Additionally, it is more preferable to use a non-alcoholic ether based solvent or a non-alcoholic ester based solvent not having terminal hydroxy groups in terms of mechanical strength.

Preferably, the resultant coating composition for insulating film production comprises i) 100 parts by weight of an organic polysiloxane precursor, ii) 200 to 2000 parts by weight of an organic solvent, and iii) 4 to 60 parts by weight of water.

Also, the composition may further comprise a pore generating material to prepare an insulating film having a dielectric constant of 2.5 or less.

For the pore generating material, any one compatible with the organic polysiloxane precursor and the organic solvent and that is thermally decomposable in the temperature range of 200 to 450° C. may be used. Preferably, a linear organic molecule or polymer, a cross-linked organic molecule or polymer, a hyper-branched organic molecule or polymer, or a dendrimer organic molecule or polymer may be used.

The present invention provides a low dielectric insulating film for a semiconductor device prepared by coating the coating composition for insulating film production on a substrate and drying and baking the same.

For the substrate, a silicon wafer, an SiO$_2$ wafer, an SiN wafer, or a compound semiconductor can be used.

The coating composition for insulating film production may be coated by a common coating method. Preferably, it may coated by spin coating, dip coating, roll coating, or spray coating to form a film having a uniform thickness. More preferably, spin coating is used when an interlayer insulating film for a multi-layered circuit semiconductor device is prepared.

Thickness of the insulating film may be controlled by varying viscosity of the coating composition and rotation speed of the spin coater. For an interlayer insulating film used in a multi-layered circuit semiconductor device, it is preferable that the insulating film has a thickness ranging from 0.05 to 2 μm.

A low dielectric insulating film having a three-dimensional structure may be formed by coating the coating composition and drying and baking it Drying may be performed by the conventional method and pre-baking and soft-baking processes may be included. During the pre-baking process, the organic solvent is evaporated slowly, and during the soft-baking process, a specific amount of the functional groups are cross-linked. The residual functional groups experience further reaction during the baking process.

Preferably, drying is performed in the temperature range of 50 to 250° C. If the temperature is below 50° C., drying may be incomplete. Otherwise, if it exceeds 250° C., hardening may proceed before sufficient drying, so that it is difficult to obtain a uniform insulating film.

Also, preferably, baking is performed at a temperature of 300° C. or higher, more preferably in a temperature range of 300 to 500° C. If the baking temperature is below 300° C., condensation of residual functional groups of the organic polysiloxane polymer is incomplete, so that the mechanical strength and dielectricity of the insulating film may worsen. The upper limit of the baking temperature may be appropriately adjusted depending on the thermal stability of the low dielectric insulating film of the present invention and the semiconductor device prepared using the same.

The drying and baking processes may be performed continuously while increasing the temperature gradually or intermittently. In case the processes are performed intermittently, it is desirable that each process is performed for 1 minute to 5 hours. Heating may be performed using a hot plate, oven, or furnace in an inert gas atmosphere of nitrogen, argon, or helium; in an oxygen atmosphere of an oxygen-containing gas (for example, air); in vacuum; or in an ammonia- or hydrogen-containing gas atmosphere. The heating method may be identical or different for the drying and baking processes.

The present invention also provides such prepared insulating film and a semiconductor device comprising the same. Because the resultant insulating film has superior dielectricity and mechanical strength, it is useful for interlayer insulating films of semiconductor devices such as large scale integrated circuits (LSIs), system LSIs, DRAMs, SDRAMs, RDRAMs, and D-RDRAMs, interlayer capping layers, hard mask layers, etch-stop layers, and so forth. In addition, it can be used for protection films or insulating films for a variety of purposes, including protection films of coating layers of semiconductor device surfaces, interlayer insulating films of multi-layered wiring substrates, protection films of liquid crystal devices, and insulation protecting films.

The coating composition for insulating film production of the present invention, an insulating film of a semiconductor device on which this composition is coated and hardened, and a semiconductor device comprising this insulating film offer significantly improved low dielectricity and mechanical strength Hereinafter, the present invention is described in more detail through examples. However, the following examples are only for the understanding of the present invention, and the present invention is not limited by the following examples.

MODE FOR INVENTION

Example 1

Preparation of Coating Composition for Insulating Film Production 100.0 g of methyltrimethoxysilane and 111.75 g of tetramethoxysilane were added to 490 g of tetrahydrofuran solvent. Then, 185 g of 0.01 N nitric acid aqueous solution was added slowly thereto. After performing reaction at room temperature for 30 minutes, the temperature was increased slowly and the reaction was performed overnight (about 16 hours) at reflux. After the reaction was completed, the reaction solution was diluted with diethyl ether solvent and washed with water until the pH became neutral. Magnesium sulfate was added to the organic layer to completely remove water. The remaining solvent of the organic layer was completely removed in a vacuum oven to obtain an organic polysiloxane precursor. The resultant organic polysiloxane precursor had a weight-average molecular weight of 2500, and of its condensable functional groups, 90% by molar ratio were hydroxy groups. The organic polysiloxane precursor was dissolved in propylene glycol methyl ether acetate solvent to a 20 wt % solution to prepare a coating composition for insulating film production.

(Preparation of Insulating Film)

1.0 g of water was added to 20 g of the prepared coating composition for insulating film production and spin coated on a silicon wafer to obtain a thin film. Pre-baking was performed on a hot plate at 80° C. and 150° C., respectively, for 1 minute. After heating to 430° C. in a furnace, hardening was performed for 1 hour to obtain an insulating film.

The prepared insulating film had a dielectric constant of 2.98, elasticity (modulus) of 16.2 Gpa, and hardness of 2.45 GPa.

Example 2

Preparation of Coating Composition for Insulating Film Production

A coating composition for insulating film production was prepared in the same manner of Example 1.

(Preparation of Insulating Film)

An insulating film was prepared as in Example 1, except for adding 1.0 g of water and 8.6 g of a 20 wt % propylene glycol methyl ether acetate solution containing a polyethylene oxide (PEO)-polypropylene oxide (PPO)-polyethylene oxide (PEO) triblock copolymer having a molecular weight of 5000 and comprising 30 wt % of polyethylene oxide (PEO) to 20 g of the coating composition for insulating film production.

The prepared insulating film had a dielectric constant of 2.26, elasticity of 5.6 Gpa, and hardness of 0.72 GPa.

Comparative Example 1

Preparation of Coating Composition for Insulating Film Production

A coating composition for insulating film production was prepared in the same manner of Example 1.
(Preparation of Insulating Film)
An insulating film was prepared as in Example 1, except that water was not added.
The prepared insulating film had a dielectric constant of 3.16, elasticity of 14.6 Gpa, and hardness of 2.1 GPa.

Comparative Example 2

Preparation of Coating Composition for Insulating Film Production

A coating composition for insulating film production was prepared in the same manner of Example 1.
(Preparation of Insulating Film)
An insulating film was prepared as in Example 0.1, except that 0.05 g of water was added.
The prepared insulating film had a dielectric constant of 3.14, elasticity of 14.4 Gpa, and hardness of 2.09 GPa.

Comparative Example 3

Preparation of Coating Composition for Insulating Film Production 100.0 g of methyltrimethoxysilane and 111.75 g of tetramethoxysilane were added to 490 g of tetrahydrofuran solvent. Then, 46.0 g of 0.01 N nitric acid aqueous solution was added slowly thereto. After performing reaction at room temperature for 30 minutes, the temperature was increased slowly and the reaction was performed overnight (about 16 hours) at reflux. After the reaction was completed, the reaction solution was diluted with diethyl ether solvent and washed with water until the pH became neutral. Magnesium sulfate was added to the organic layer to completely remove water. The remaining solvent of the organic layer was completely removed in a vacuum oven to obtain an organic polysiloxane precursor. The resultant organic polysiloxane precursor had a weight-average molecular weight of 3300, and of its condensable functional groups, 60% were hydroxy groups by molar ratio. The organic polysiloxane precursor was dissolved in propylene glycol methyl ether acetate solvent to a 20 wt % solution to prepare a coating composition for insulating film production.
(Preparation of Insulating Film)
An insulating film was prepared as in Example 1, except that 0.5 g of water was added.
The prepared insulating film had a dielectric constant of 3.10, elasticity of 12.4 Gpa, and hardness of 1.83 GPa.

Comparative Example 4

Preparation of Coating Composition for Insulating Film Production

A coating composition for insulating film production was prepared in the same manner of Example 1.
(Preparation of Insulating Film)
An insulating film was prepared as in Example 2, except that water was not added.
The prepared insulating film had a dielectric constant of 2.33, elasticity of 4.9 Gpa, and hardness of 0.60 GPa.

Comparative Example 5

Preparation of Coating Composition for Insulating Film Production 7.5 g of methyltrimethoxysilane and 11.46 g of tetraethoxysilane were added to a mixture solution of 104.1 g of distilled water and 266.4 g of ethanol. After adding 3.0 g of 40% methylamine aqueous solution 60° C., reaction was performed for 2 hours. Then, 120 g of propylene glycol monopropyl ether was added and the solvent was evaporated using a rotary evaporator until the total solution weight became 60 g. The prepared organic polysiloxane precursor had a weight-average molecular weight of 890,000.
(Preparation of Insulating Film)
An insulating film was prepared as in Example 1, except that 1.0 g of water was added to 20 g of the coating composition for insulating film production.
The prepared insulating film had a dielectric constant of 2.21, elasticity of 4.41 Gpa, and hardness of 0.60 GPa.

Comparative Example 6

Preparation of Coating Composition for Insulating Film Production

A coating composition for insulating film production was prepared in the same manner of Comparative Example 5.
(Preparation of Insulating Film)
An insulating film was prepared as in Example 1, except that water was not added.
The prepared insulating film had a dielectric constant of 2.20, elasticity of 4.31 Gpa, and hardness of 0.59 GPa.

Comparative Example 7

Preparation of Coating Composition I for Insulating Film Production

Base Catalyst Reaction

A coating composition for insulating film production was prepared in the same manner of Comparative Example 5.
(Preparation of Coating Composition II for Insulating Film Production II (Acid Catalyst Reaction))
100.0 g of methyltrimethoxysilane and 44.7 g of tetraethoxysilane were added to 300 g of tetrahydrofuran solvent. Then, it was mixed with 262.2 g of distilled water, and 29.1 g of 0.1 N nitric acid aqueous solution was added slowly thereto. After performing reaction at room temperature for 30 minutes, the temperature was increased slowly and the reaction was performed overnight (about 24 hours) at reflux. After the reaction was completed, the reaction solution was diluted with diethyl ether solvent and washed with water until the pH became neutral. Magnesium sulfate was added to the organic layer to completely remove water. The remaining solvent of the organic layer was completely removed in a vacuum oven to obtain an organic polysiloxane precursor. The resultant organic polysiloxane precursor had a weight-average molecular weight of 1680. The organic polysiloxane precursor was dissolved in propylene glycol methyl ether acetate solvent to a 20 wt % solution to prepare a coating composition for insulating film production.

(Preparation of Insulating Film)

An insulating film was prepared as in Example 1, except for adding 3.0 g of water to a mixture solution of 60 g of the coating composition I for insulating film production and 20 g of the coating composition II for insulating film production.

The prepared insulating film had a dielectric constant of 2.49, elasticity of 6.8 Gpa, and hardness of 1.0 GPa.

Comparative Example 8

Preparation of Coating Composition I for Insulating Film Production

Base Catalyst Reaction

A coating composition for insulating film production was prepared in the same manner of Comparative Example 5.

(Preparation of Coating Composition II for Insulating Film Production II (Acid Catalyst Reaction))

A coating composition for insulating film production was prepared in the same manner of Comparative Example 7.

(Preparation of Insulating Film)

An insulating film was prepared as in Comparative Example 7, except that water was not added.

The prepared insulating film had a dielectric constant of 2.48, elasticity of 6.7 Gpa, and hardness of 1.0 GPa.

Comparative Example 9

Preparation of Coating Composition I for Insulating Film Production

Base Catalyst Reaction

A coating composition for insulating film production was prepared in the same manner of Comparative Example 5.

(Preparation of Insulating Film)

An insulating film was prepared as in Example 1, except for adding 0.3 g of a 20 wt % polyethylene oxide (PEO)-polypropylene oxide (PPO)-polyethylene oxide (PEO) triblock copolymer having a molecular weight of 5000 and comprising 30 wt % of polyethylene oxide (PEO) to 20 g of the coating composition for insulating film production.

The prepared insulating film had a dielectric constant of 2.33, elasticity of 4.8 GPa and hardness of 0.56.

Mechanical strength and dielectric constants of the insulating films prepared in Examples 1 and 2 and Comparative Examples 1 to 9 were measured by the following method. The results are shown in Table 1 below.

a) Mechanical strength—The insulating film was spin coated on a silicon wafer and hardened. Then, mechanical strength was measured using a Nano Indenter.

b) Dielectric constant—The insulating film was spin coated on a silicon wafer by the MIS (metal insulator semiconductor) method and hardened. Then, Al (aluminum) was deposited on the insulating film, and the dielectric constant was measured at 1 MHz.

c) Molar ratios of hydroxy groups to the condensable functional groups of the organic polysiloxane precursor prepared in Example 1 were measured by $^1$H-NMR spectroscopy. The results are shown in FIG. 1.

TABLE 1

| Classification | Weight-average molecular weight | Water (g) | Pore generating material | Dielectric constant | Elasticity (GPa) | Hardness (GPa) |
|---|---|---|---|---|---|---|
| Example 1 | 2,500 | 1.0 | X | 2.98 | 16.2 | 2.45 |
| Example 2 | 2,500 | 1.0 | ○ | 2.26 | 5.6 | 0.72 |
| Comparative Example 1 | 2,500 | X | X | 3.16 | 14.6 | 2.10 |
| Comparative Example 2 | 2,500 | 0.05 | X | 3.14 | 14.4 | 2.09 |
| Comparative Example 3 | 3,300 | 0.5 | X | 3.10 | 12.8 | 1.83 |
| Comparative Example 4 | 2,500 | X | ○ | 2.33 | 4.9 | 0.60 |
| Comparative Example 5 | 890,000 | 1.0 | X | 2.21 | 4.4 | 0.6 |
| Comparative Example 6 | 890,000 | X | X | 2.20 | 4.31 | 0.59 |
| Comparative Example 7 | 890,000 + 1,680 | 3.0 | X | 2.49 | 6.8 | 1.0 |
| Comparative Example 8 | 890,000 + 1,680 | X | X | 2.48 | 6.7 | 1.0 |
| Comparative Example 9 | 890,000 | 1.0 | ○ | 2.33 | 4.8 | 0.56 |

As seen in Table 1, the insulating film of Example 1, which was prepared from a coating composition for insulating film production comprising an organic polysiloxane precursor having a small molecular weight and a specific amount of water, had a lower dielectric constant and better elasticity than the insulating films of Comparative Examples 1 to 4, which comprised no water or a trace of water.

Also, when the pore generating material was added to form pores, the insulating film of Example 2 had a lower dielectric constant and better elasticity than the insulating film of Comparative Example 4.

As seen in Comparative Examples 5 to 9, when the organic polysiloxane having a large molecular weight was prepared by the base catalyst reaction, improvement of dielectricity and mechanical strength due to water was slight. Also, as seen in Comparative Examples 5 and 9, it was possible to effectively reduce the dielectric constant when the insulating film comprised an organic polysiloxane precursor having a large molecular weight. However, a small amount of small molecular weight organic polysiloxane prevented pore generation and thus increased the dielectric constant.

When an organic polysiloxane precursor having a large molecular weight was used along with the pore generating material as in Comparative Example 9, pore generation was not effective, and the dielectric constant increased.

As seen in Table 1, the coating composition for insulating film production of the present invention offered an insulating film having a low dielectric constant and superior mechanical strength.

As described above, the present invention provides a coating composition for insulating film production having a low dielectric constant and significantly improved mechanical strength, an insulating film for a semiconductor device prepared by coating and hardening the composition, and a semiconductor device comprising the insulating film.

While the present invention has been described in detail with reference to the preferred embodiments, those skilled in the art will appreciate that various modifications and substitutions can be made thereto without departing from the spirit and scope of the present invention as set forth in the appended claims.

The invention claimed is:

1. A preparation method of a low dielectric insulating film comprising the steps of:
    a) preparing an organic polysiloxane precursor having a weight-average molecular weight ranging from 500 to 30,000, and a molar ratio of hydroxy groups 80% or more of the total condensable functional groups;
    b) preparing a coating composition for production of insulating film by mixing i) said organic polysiloxane precursor, ii) an organic solvent, and iii) water;
    c) coating said coating composition on a substrate of a semiconductor device; and
    d) drying and baking said coating composition to produce insulating film,
    wherein the organic polysiloxane precursor is prepared by hydrolyzation and condensation of one or more silane compounds selected from the group consisting of silane compounds represented by Chemical Formulas 1 to 3 below:

$$SiR^1_p R^2_{4-p} \qquad \text{Chemical Formula 1}$$

where
$R^1$ is hydrogen, an aryl, a vinyl, an allyl, or a linear or branched $C_1$ to $C_4$ alkyl substituted by fluorine or unsubstituted, $R^2$ is a linear or branched $C_1$ to $C_4$ alkoxy, and
p is an integer of 1 or 2, $$R^3_q R^4_{3-q} Si-M-SiR^5_r R^6_{3-r} \qquad \text{Chemical Formula 2}$$

where
each of $R^3$ and $R^5$ is hydrogen, fluorine, an aryl, a vinyl, an allyl, or a linear or branched $C_1$ to $C_4$ alkyl substituted by fluorine or unsubstituted,
each of $R^4$ and $R^6$ is a linear or branched $C_1$ to $C_4$ alkoxy,
M is a $C_1$ to $C_6$ alkylene or phenylene, and
each of q and r is an integer of 0 to 2, and $$R^7_n \underbrace{\phantom{XX}}_{} -SiO \underbrace{\phantom{XX}}_{m} R^8_{2m-n} \qquad \text{Chemical Formula 3}$$

where
$R^7$ is hydrogen, fluorine, an aryl, a vinyl, an allyl, or a linear or branched $C_1$ to $C_4$ alkyl substituted by fluorine or unsubstituted,
$R^8$ is hydrogen, a hydroxy, or a linear or branched $C_1$ to $C_4$ alkoxy or $-(CH_2)_a-SiR^9 R^{10}$ (where a is 2 or 3),
$R^9$ is fluorine, an aryl, a vinyl, an allyl, or a linear or branched $C_1$ to $C_4$ alkyl substituted by fluorine or unsubstituted,
$R^{10}$ is a linear or branched $C_1$ to $C_4$ alkoxy, and
each of m and n is an integer of 3 to 7.

2. The preparation method of claim 1, said composition comprising i) 100 parts by weight of an organic polysiloxane precursor; ii) 200 to 2000 parts by weight of an organic solvent, and iii) 4 to 60 parts by weight of water.

3. The preparation method of claim 1, the preparing the coating composition further comprising mixing iv) a pore generating material with i) said organic polysiloxane precursor, ii) the organic solvent, and iii) the water.

4. The preparation method of claim 3, iv) the pore generating material weighs 5 to 100 parts by weight for 100 parts by weight of said organic polysiloxane precursor.

5. The preparation method of claim 3, said pore generating material being one of materials selected from a group consisting of linear organic molecules, linear organic polymers, cross-linked organic molecules, cross-linked organic polymers, hyper-branched organic molecules, hyper-branched polymers, dendrimer organic molecules, and dendrimer organic polymers that are thermally decomposable in the temperature range of 200 to 450° C.

* * * * *